US007331190B2

(12) United States Patent
Garner et al.

(10) Patent No.: US 7,331,190 B2
(45) Date of Patent: Feb. 19, 2008

(54) LIQUID/COOLANT SYSTEM INCLUDING BOILING SENSOR

(75) Inventors: Colin Peter Garner, Loughborough (GB); Adrian Holland, Alton (GB)

(73) Assignee: Perkins Engines Company Limited, Peterborough (GB)

( * ) Notice: Subject to any disclaimer, the term of this patent is extended or adjusted under 35 U.S.C. 154(b) by 0 days.

(21) Appl. No.: 10/732,219

(22) Filed: Dec. 11, 2003

(65) Prior Publication Data

US 2004/0194910 A1 Oct. 7, 2004

(30) Foreign Application Priority Data

Dec. 12, 2002 (EP) .................................. 02258570

(51) Int. Cl.
*F25D 17/00* (2006.01)
*F25D 23/12* (2006.01)
*H05K 7/20* (2006.01)

(52) U.S. Cl. ...................... 62/178; 62/259.2; 62/259.4; 361/696

(58) Field of Classification Search .................. 62/178, 62/259.2, 259.4, 118, 132; 165/111, 288, 165/300; 361/696
See application file for complete search history.

(56) References Cited

U.S. PATENT DOCUMENTS

| 4,768,484 | A | 9/1988 | Scarselletta |
| 5,050,114 | A | 9/1991 | Lee |
| 5,099,908 | A | 3/1992 | Taraci et al. |
| 5,178,463 | A | 1/1993 | Berry, Jr. et al. |
| 6,193,905 | B1 | 2/2001 | Yamada et al. |
| 6,354,370 | B1 | 3/2002 | Miller et al. |

FOREIGN PATENT DOCUMENTS

| DE | 199 00 132 A1 | 7/2000 |
| JP | 60-36717 | 2/1985 |
| WO | WO 88/04031 | 6/1988 |

OTHER PUBLICATIONS

A. Holland, "Nucleate Boiling From Micro-Machined Surfaces", Proceedings of HT2003, ASME Summer Heat Transfer Conference, Jul. 21-23, 2003 Las Vegas, Nevada, USA, 5 pages.

(Continued)

*Primary Examiner*—Chen Wen Jiang

(57) ABSTRACT

Coolant systems, for power sources (e.g. internal combustion engines, fuel cells, and nuclear reactors) or microprocessors for example, are beneficially operated with coolant in a nucleate boiling state, but transitions to damaging film boiling are then possible. The disclosed coolant system includes a sensor, such as a thermocouple or thermistor, that provides a signal representative of fluctuations in the temperature at a heated surface. The signal also includes at least one parameter. A controller processes the signal to determine changes in the parameter of the signal and/or to determine the state of the coolant and can responsively change the coolant flow to avoid undesirable coolant states. For example, coolant flow can be changed by changing the output of a coolant pump. The controller can change coolant flow automatically, or a signal can be provided to an operator that an undesirable coolant state change is imminent or has occurred, thereby allowing operator intervention. The system may also be used with liquids other than coolant.

78 Claims, 3 Drawing Sheets

OTHER PUBLICATIONS

Dr. DBR Kenning, "EPSRC-supported project: Boiling in Compact Heat Exchangers," Abstract, date unknown, 1 page.

Dr. DBR Kenning, EPSRC-supported project: Nucleate Boiling Heat Transfer: Effect of Wall Properties & Surface Condition, Abstract, date unknown, 1 page.

Dr. C.P. Garner, "Fundamental Studies of Nucleate Boiling Dynamics for IC Engines", Department of Mechanical Engineering, Loughborough University, date unknown, 9 pages.

A. Holland, "The Effects of Micro-Machined Surface Features on Nucleate Boiling", Research Student End of Year 2 Progress Report, Oct. 1, 2002, 11 pages.

S. H. Bhavnani et al., "Immersion-Cooled Heat Sinks for Electronics: Insight From High-Speed Photography", 2000 Inter Society Conference on Thermal Phenomena, IEEE, pp. 310-320, date unknown.

A. Calka et al., "Some aspects of the interaction among nucleation sites during saturated nucleate boiling", Int. J. Heat Mass Transfer, vol. 28, No. 12, pp. 2331-2342 (1985).

I. Golobič et al., "Interactions between laser-activated nucleation sites in pool boiling", Int. J. Heat and Mass Transfer, 44, pp. 143-153 (2001).

R.L. Judd et al., "The Nature of Nucleation Site Interaction", Journal of Heat Transfer, vol. 102, pp. 461-464, Aug. 1980.

P. Sadasivan et al., "Nonlinear Aspects of High Heat Flux Nucleate Boiling Heat Transfer", vol. 117, pp. 981-989, Nov. 1995.

R.L. Judd, "On Nucleation Site Interaction", Journal of Heat Transfer, vol. 110, pp. 475-478, May 1988.

D.B.R. Kenning, "Wall temperature patterns in nucleate boiling", Int. J. Heat and Mass Transfer, vol. 35, No. 1, pp. 73-86, (1992).

R.L. Judd et al., "Interaction of the Nucleation Processes Occurring at Adjacent Nucleation Sites", Journal of Heat Transfer, vol. 115, pp. 955-962, Nov. 1993.

Search report from European Patent Office in related European application No. 02258570.7, dated May 14, 2003.

LIQUID/COOLANT SYSTEM INCLUDING BOILING SENSOR

TECHNICAL FIELD

This invention relates to liquid and/or coolant systems and, more particularly, to such systems in which a boiling sensor provides quantitative and/or qualitative information about liquid boiling that may be used to control liquid flow.

BACKGROUND

Liquid coolant systems can play a major role in the performance and safety of the device being cooled. For example, the coolant system can be especially important for power sources, such as internal combustion engines, fuel cells, and nuclear reactors, and for semiconductor chips such as microprocessors. In an internal combustion engine, the coolant system can be used to maintain engine operating temperature sufficiently high that the combustion system operates at or near peak efficiency while preventing engine temperatures so high that engine components are damaged. Likewise, the coolant system of a nuclear reactor is important in avoiding reactor damage and catastrophic reactor failure. In some fuel cells, coolant is carefully controlled at elevated temperatures but boiling of coolant should be avoided. Similarly, it is well known that semiconductor chip performance can be enhanced, or performance decay can be avoided, by keeping the semiconductor chip in a specified temperature range. Coolant systems in HVAC systems, refrigerators, and other refrigeration or cooling devices can also be controlled to improve system efficiency and to avoid damage. Other areas where coolant control can be useful are liquid cooled machine tools and casting and manufacturing processes.

FIG. 1 graphically illustrates energy transfer from a heated surface, such as a surface in a coolant circuit having a surface temperature T, to a liquid, such as a coolant, in contact with the surface, the coolant having a saturation temperature $T_{sat}$. For relatively low heat flux q", excess temperature or superheat ($T_s-T_{sat}$) is less than $T_1$ and heat transfer from the surface to the coolant is by way of convective heat transfer. The convective heat transfer can be natural or forced, depending on whether the coolant is flowing across the surface. As heat flux q" increases, nucleation occurs and superheat rises to a range between $T_1$ and $T_2$. In this state, discrete bubbles are formed at the surface and so-called "nucleate boiling heat transfer" occurs. As heat flux q" increases even more, the coolant begins to approach boiling crisis. Discrete bubbles are no longer formed but instead columns or slugs of vapor are formed and merging bubbles occur. Although heat transfer in this state is a form of nucleate boiling heat transfer, it is often referred to as "slug boiling" or "aggressive boiling" heat transfer. Superheat is between $T_2$ and $T_3$ in this state. Further increasing heat flux q" drives the liquid toward the peak of the graph of FIG. 1, at which point heat flux q" reaches a local maximum and superheat reaches $T_3$. This point is referred to as "critical heat flux" (CHF), "departure from nucleate boiling" (DNB), "boiling crisis", "onset of film boiling" or "burnout". Once the heat flux q" reaches critical heat flux, any further increase will cause the coolant to depart from nucleate boiling and jump to a state of film boiling heat transfer in which a film of vapor is formed across the surface, thus preventing the formation and departure of bubbles. During film boiling heat transfer, heat flux increases only a small amount, if at all, but superheat rapidly increases by several hundred degrees to $T_4$ as the coolant transitions along the horizontal dashed line in FIG. 1.

To enhance heat transfer from a heated surface in a coolant circuit to the coolant medium, it is known to use liquid coolant in a nucleate boiling state rather than relying on only natural convective heat transfer since, as shown in FIG. 1, higher flux q" (as compared with convective heat transfer) is possible with a relatively low superheat and thus a relatively low surface temperature $T_s$. As well known, nucleate boiling occurs when bubbles form at the heated surface due to pockets of vapor trapped in cavities or other imperfections in the surface. As the bubbles depart the surface, lower temperature coolant spaced from the surface is drawn down to the surface, which decreases the surface temperature $T_s$. However, as mentioned above, as heat flux increases, the coolant transitions into a slug boiling state and approaches critical heat flux or departure from nucleate boiling. In internal combustion engine, for example, coolant that is in a nucleate boiling state, and particularly a slug boiling state, can undesirably depart from nucleate boiling during periods of high engine loading or after the a hot shut down when coolant is no longer circulating. Similarly, in semiconductor chip cooling for example, prolonged operation of the semiconductor chips, such a microprocessors, at high loading or a rapid shut down of computing system could result in film boiling. Thus, the coolant can transition instantly to a film boiling heat transfer regime in which the surface temperature $T_s$ can rapidly rise to an extremely high temperature at which damage or even catastrophic system failure can occur.

Thus, while the benefits of nucleate boiling can be harnessed to improve coolant system performance, coolant system designers have traditionally designed systems to avoid nucleate boiling heat transfer in order to avoid the damaging transitions to film boiling heat transfer. However, with regard to internal combustion engines for example, the increasing stringency of engine emissions regulations is expected to result in more demanding heat rejection requirements as higher engine operating temperatures and cooled exhaust gas recirculation, for example, are used to reduce engine emissions. Increased heat transfer demands are also anticipated in connection with semiconductor chip cooling as processing speed and chip density continue to increase. Thus, the heat transfer benefits of nucleate boiling are expected to become more attractive.

Efforts have been made to harness the energy transfer benefits of nucleate boiling in coolant systems. For example, U.S. Pat. No. 4,768,484 to Scarselletta discloses a coolant system in which coolant is maintained in a state of nucleate boiling at a selected location in the coolant passages of an engine. A coolant pump is controlled to adjust the static pressure of the flowing coolant at the selected location so that nucleate boiling occurs at the selected location. Temperature and pressure sensors supply signals to a microprocessor that uses look-up tables to predict whether, based on the sensed temperature and pressure, the coolant is in a nucleate boiling state and then controls the speed of the coolant pump to maintain the coolant at the selected location in a state of nucleate boiling. However, systems such as described in U.S. Pat. No. 4,768,484 have shortcomings because they require multiple sensors and an electronic controller with extensive look-up table capabilities, an expensive and delicate pressure sensor, and knowledge of the coolant's physical properties. Such systems are also subject to error associated with the randomness and unpredictability of departure from nucleate boiling resulting from the random nature of surface cavities and imperfections.

Thus, to make such systems practical, high cost and low durability components are likely required together with control algorithms that permit only low efficiency, early-stage discrete nucleate boiling so that errors in the boiling state calculations (e.g. from wrong coolant properties, sensor error) do not accidentally allow a damaging transition to film boiling.

In the context of semiconductor chip cooling, it is known to utilize nucleate boiling heat transfer improve semiconductor chip performance. However, because undesirable transitions to damaging film boiling are possible unless the coolant system is carefully controlled, damage to the semiconductor chip is a concern. Damaging the semiconductor chip, especially a microprocessor, can be especially troublesome for critical high-performance computer systems, since microprocessor damage can result in costly system downtime and potentially loss of valuable data.

Accordingly, a need exists for a liquid and/or coolant system that can be used to maintain liquid/coolant in a desired state (e.g. discrete nucleate boiling) and thus avoid transitions to undesired states (e.g. slug boiling, film boiling), but which is relatively simple, robust, and provides accurate quantitative and/or qualitative information about the state of the liquid/coolant.

SUMMARY OF THE INVENTION

A liquid system in accordance with one aspect of this invention comprises a liquid circuit in which liquid can flow adjacent a surface in the liquid circuit. A sensor is adapted to provide a sensor signal having at least one parameter. The sensor signal may be representative of fluctuation in temperature at the surface in said liquid circuit. A signal processor may be configured to receive the sensor signal and determine a change in the at least one parameter of the sensor signal. Liquid flow adjacent to said surface may be changeable in response to the change in the at least one parameter of the sensor signal.

A method of controlling a liquid system according to another aspect of this invention comprises the steps of (a) causing liquid to flow with first flow parameters adjacent a surface in a liquid circuit, (b) creating a signal having at least one signal parameter. The signal may be representative of a temperature fluctuations at or near the surface in the liquid circuit, (c) determining a change in the at least one signal parameter, and (d) causing liquid to flow adjacent to said surface with second flow parameters different from said first flow parameters in response to the change in the at least one signal parameter. Step (d) can be carried out automatically or by operator intervention.

Other features and aspects of this invention will become apparent from the following description and the accompanying drawings.

DETAILED DESCRIPTION

Figure 2:
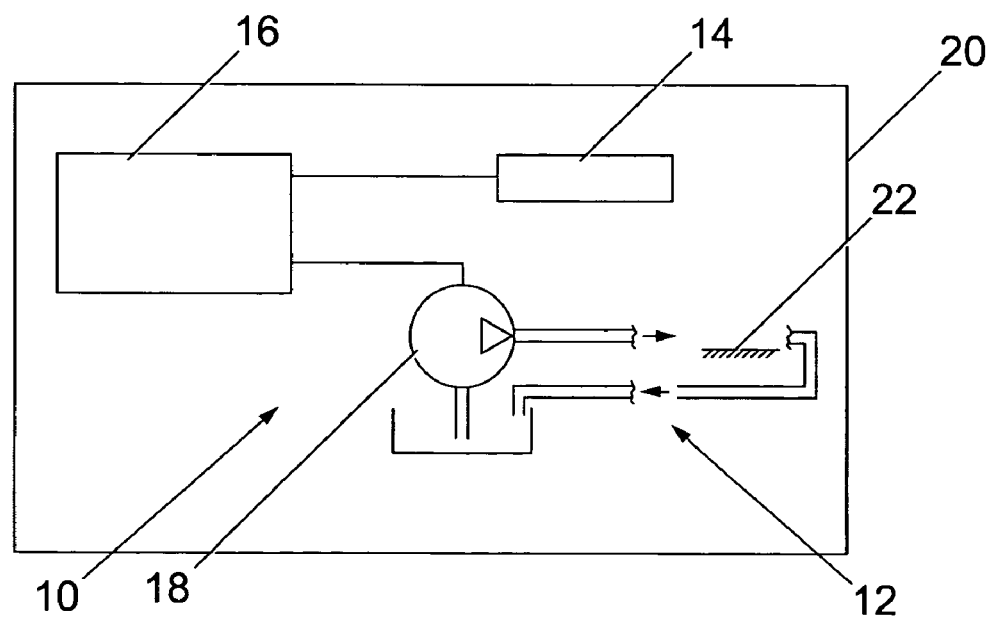
FIG. 2 is a diagrammatic representation of a first embodiment of a coolant system in accordance with this invention.

FIG. 2 diagrammatically illustrates a first embodiment of a coolant system, generally designated 10, in accordance with this invention. The coolant system 10 comprises a coolant circuit 12, a sensor 14, a controller 16, and a pump 18. The coolant system 10 may be used with or form part of a device, generally designated 20, which is to be fully or partly cooled. The sensor 14 provides a signal to the controller 16 that is representative of fluctuations in the surface temperature $T_s$ at or near a surface 22 in the coolant circuit 12. The controller 16 is capable of analyzing the sensor signal and, based on changes in one or more parameters of the sensor signal, changing the coolant flow adjacent to the surface 22.

In the embodiment of FIG. 2, coolant flow is changed by changing the output flow rate of the pump 18. As will be discussed in more detail below, the flow parameters of the coolant flow adjacent to the surface 22 can be changed to alter the heat transfer regime in which the coolant system operates. The principal parameters of the coolant flow that impact the boiling state, and thus the heat transfer regime, are the coolant velocity, the coolant temperature, and the coolant pressure at the surface 22. Disrupting or breaking-up the boundary layer at the surface 22, which may be accomplished by causing turbulent flow at the surface 22, can also change the boiling state of the coolant. Thus, for purposes of this invention, coolant flow adjacent to the surface 22 can be changed by changing the velocity, temperature, or pressure of the coolant or changing the turbulence of the flow at the surface 22. As apparent, changing the output flow rate of the pump 18 is one manner in which to change the coolant velocity. Although not shown, coolant temperature adjacent the surface 22 can be changed by directing low temperature coolant flow toward the surface, as by use of a variable coolant deflector to direct lower temperature coolant or by selectively allowing lower temperature coolant to flow adjacent to the surface 22 by way opening or closing a by-pass valve. Using a variable deflector to direct coolant flow toward the surface 22 can change the turbulence of the coolant flow and break-up the boundary layer. Coolant pressure adjacent to the surface 22 may also be changed, but in practice, changing coolant pressure is expected to be more difficult than changing coolant velocity or temperature.

The sensor 14 may be any suitable sensor that provides a signal representative of fluctuations in temperature at the surface 22. For example, the sensor 14 may be a conventional thermocouple that is positioned close to the surface 22, as by positioning the thermocouple in a blind recess or hole (not shown) formed in the coolant circuit structure on which the surface 22 is formed. The blind recess or hole may be formed by drilling or any other suitable method. Thermocouples are well known in the art, and as such, the thermocouple is not described in detail. Those skilled in the art will recognize that conventional thermocouples can comprise a pair of twisted wires, either encapsulated or not, so that the dilled or other hole for the sensor can be quite small. The thermocouple can be held in position in any suitable manner, as by the use of adhesive for example. Alternatively, the sensor 14 may be a thermistor, although current thermistor technology is believed to have limitations in that its effective range of temperature measurement is only about 100° C. (e.g. −20° C. to +80° C.). Nonetheless, for certain applications or given advancements in thermistor technology, the sensor 14 may include a thermistor.

The sensor 14 may include a single instrument, such as a single thermocouple, or it may comprise plural instruments positioned in array or line at or near the surface 22. As apparent, the use of plural sensor instruments allows collection of more data regarding temperature fluctuations at or near the surface 22. Additional sensors (not shown) may also be positioned at or near other surfaces (not shown) in the coolant system to provide signals to the controller 16 representative of fluctuations in surface temperatures at or near those other surfaces.

An optional second sensor (not shown) can be positioned to measure fluctuations in the temperature of the coolant adjacent to the surface 22. The optional sensor is positioned in the coolant a small distance, 1 mm for example, above the surface 22. As apparent, the optional second sensor should not be positioned to effect the temperature at the surface 22, but the optional second sensor would be positioned closely adjacent the primary sensor 14. For example, the option second sensor may extend through small drilled hole in a wall of the coolant surface structure and extend into the coolant to a position near to but spaced above the primary sensor 14. The optional second sensor thus provides a signal to the controller 16 representative of temperature fluctuations in the boundary layer that can be used to assess the condition of the coolant at the interface or boundary between the surface 22. The optional second sensor may be any suitable sensor as described above with regard to the primary sensor 14.

The controller 16 can be a conventional microprocessor controller or other suitable programmable logic controller and, as such, is not described further herein. The controller 16 can be a single controller device or may include separate controller devices that interact to control various parts of the coolant system 10 or the device 20 that is being cooled. In this regard, the term "controller" as used herein applies equally to a single controller device that carries out the relevant control functions or to multiple controller devices that cooperate to carry out the relevant control functions.

Figure 3:
FIG. 3 is a graphical representation of a sensor signal showing fluctuations in temperature at or adjacent a heated surface in a coolant circuit, the coolant operating in a convective heat transfer regime.

FIG. 3 graphically illustrates the signal from sensor 14 when the coolant system is operating in a convective heat transfer regime. The temperature $T_s$ of the surface 22 is approximately equal to the saturation temperature $T_{sat}$ of the coolant, and the surface temperature $T_s$ is substantially constant. Thus, the sensor 14 measures little or no fluctuation in the surface temperature $T_s$.

Figure 4:
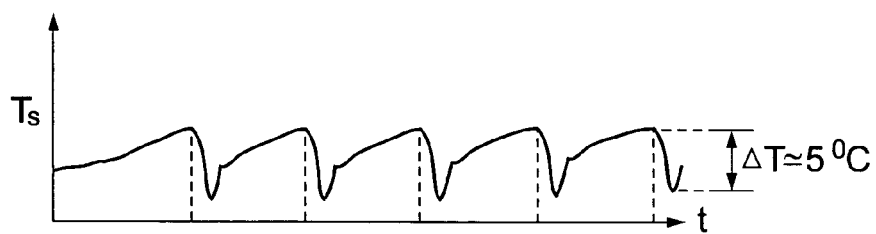
FIG. 4 is a graphical representation of a sensor signal showing fluctuations in temperature at or adjacent a heated surface in a coolant circuit, the coolant operating in an early-stage discrete nucleate boiling heat transfer regime.

FIG. 4 graphically illustrates the signal from the sensor 14 as heat flux q" increases and the coolant system begins to operate in a discrete nucleate boiling heat transfer regime. As mentioned above, during discrete nucleate boiling heat transfer, small vapor bubbles (not shown) are formed at the surface 22. As these bubbles grow, the surface temperature $T_s$ rises. When a bubble breaks away and departs from the surface 22, lower temperature coolant above the bubble rushes down to the surface 22 and causes the surface temperature $T_s$ to drop rapidly. Thus, the surface temperature fluctuation represented in the signal of sensor 14 can be used to detect when a vapor bubbles depart the surface 22. As shown in FIG. 4, bubble departure occurs at points A, which correspond to temperature peaks. During this early-stage discrete nucleate boiling, the decrease in surface temperature T upon bubble departure is expected to be about 5° C.

Figure 5:
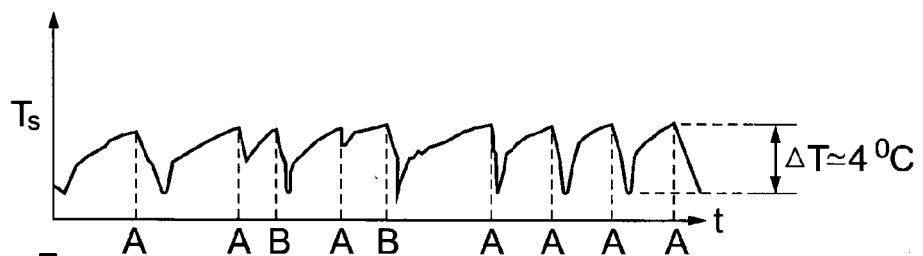
FIG. 5 is a graphical representation of a sensor signal showing fluctuations in temperature at or adjacent a heated surface in a coolant circuit, the coolant operating in a vigorous discrete nucleate boiling heat transfer regime.

As heat flux q" increases, the coolant system remains in a nucleate boiling heat transfer regime but moves into vigorous discrete nucleate boiling as depicted by the sensor signal shown in FIG. 5. During vigorous discrete nucleate boiling, bubble departure is more rapid or at a higher rate. In addition, bubble departure is somewhat less predictable and some bubbles may form rapidly after the previous bubble departure. Thus, extra bubble departures may occur between the expected bubble departures, as indicated at B. The decrease in surface temperature $T_s$ upon bubble departure during vigorous nucleate boiling is expected to decline to about 4° C.

Figure 6:
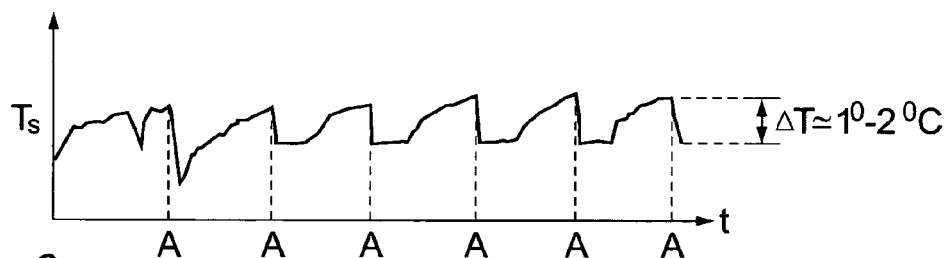
FIG. 6 is a graphical representation of a sensor signal showing fluctuations in temperature at or adjacent a heated surface in a coolant circuit, the coolant operating in a slug boiling heat transfer regime.

FIG. 6 graphically illustrates the signal from sensor 14 as heat flux q" increases even more and the coolant system begins to operate in a slug boiling heat transfer regime. As illustrated by the sensor signal, the surface temperature $T_s$ gradually climbs until a slug departs the surface 22, as indicated at points A on the graph of FIG. 6. Upon slug departure, the surface temperature drops rapidly, but only by 1° C. or 2° C. in this case. After the surface temperature $T_s$ drops rapidly, the temperature T remains substantially constant for a short period of time prior to a gradual climb in temperature up to the next slug departure.

Figure 1:
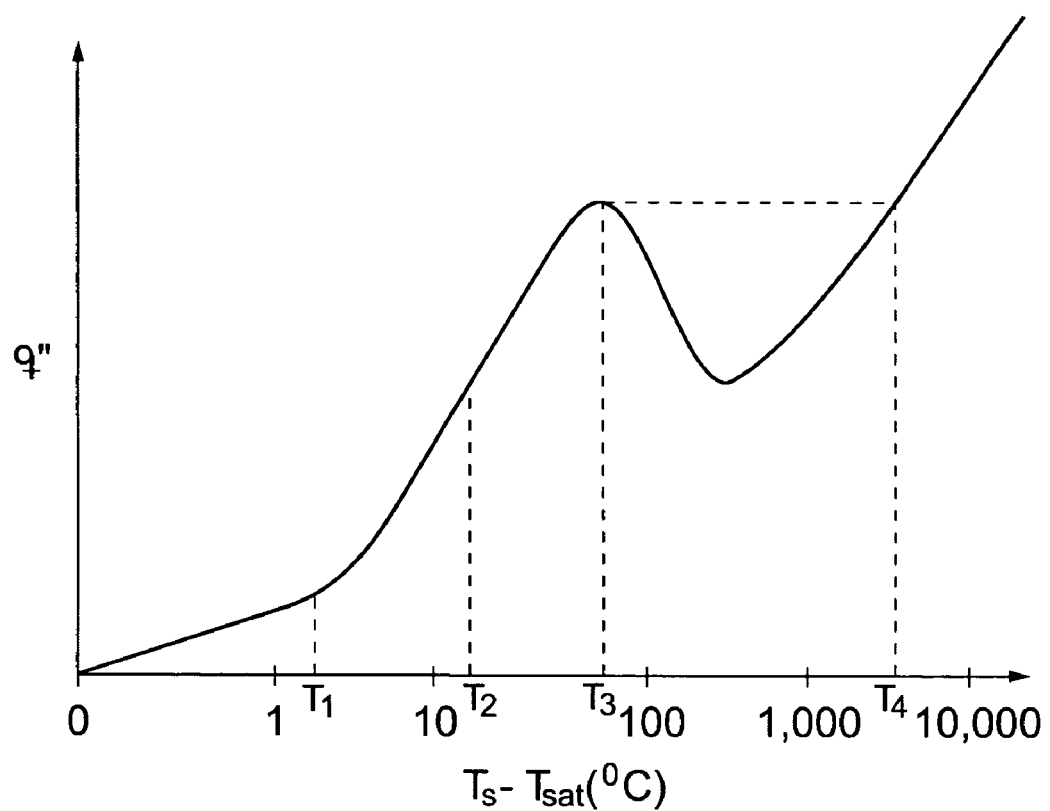
FIG. 1 is a graphical characterization of energy transfer from a heated surface, such as surface in a coolant circuit for example, to liquid adjacent the heated surface.
Figure 7:
FIG. 7 is a graphical representation of a sensor signal showing fluctuations in temperature at or adjacent a heated surface in a coolant circuit, the coolant operating in a film boiling heat transfer regime.

FIG. 7 graphically illustrates the signal from the sensor 14 as the coolant system 10 begins to operate in a film boiling heat transfer regime. The sensor signal now show no rapid drops in surface temperature $T_s$, indicating that no bubbles or slugs are departing the surface 22. Although some fluctuations in surface temperature $T_s$ are present, the fluctuations are gradual and the change in surface temperature T between peaks and valleys is now very small, likely less that 1° C. The surface temperature $T_s$ is now much higher than $T_{sat}$ and will continue to rise rapidly. As shown in FIG. 1, the surface temperature $T_s$ can rise rapidly to 1000° C. or more above $T_{sat}$.

Figure 8:
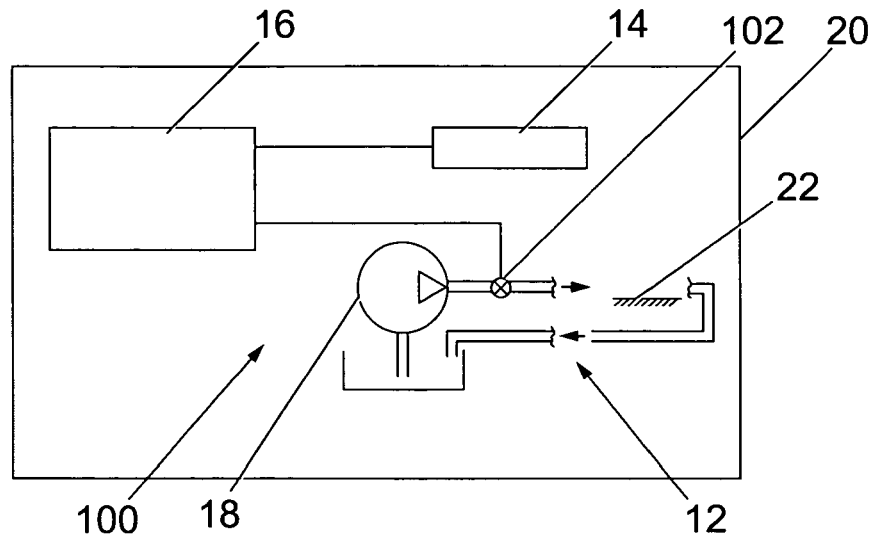
FIG. 8 is a diagrammatic representation of a second embodiment of a coolant system in accordance with this invention.

FIG. 8 illustrates a second embodiment of a coolant system, generally designated 100, in accordance with this invention. This second and the further embodiments discussed below are similar to the coolant system 10 of FIG. 2 and like components are designated by like numerals. In the coolant system 100, controlling the flow of coolant through a coolant flow control valve, diagrammatically designated 102, changes coolant flow adjacent to the surface 22. The control valve 102 may be operated to change the flow of coolant therethrough to thereby change the flow of coolant adjacent to the surface 22. The control valve 102 may be a by-pass valve that allows a change in the coolant flow through a heat exchanger or it may be a flow directing valve to control the selective flow of lower temperature coolant toward the surface 22. The control valve 102 may be a two-way, on/off valve or it may be a proportional valve.

Although not shown, those skilled in the art will also recognize that the coolant circuit 12 may utilize variable geometry passages in the vicinity of the surface 22 to locally increase coolant velocity or otherwise change the coolant flow.

Figure 9:
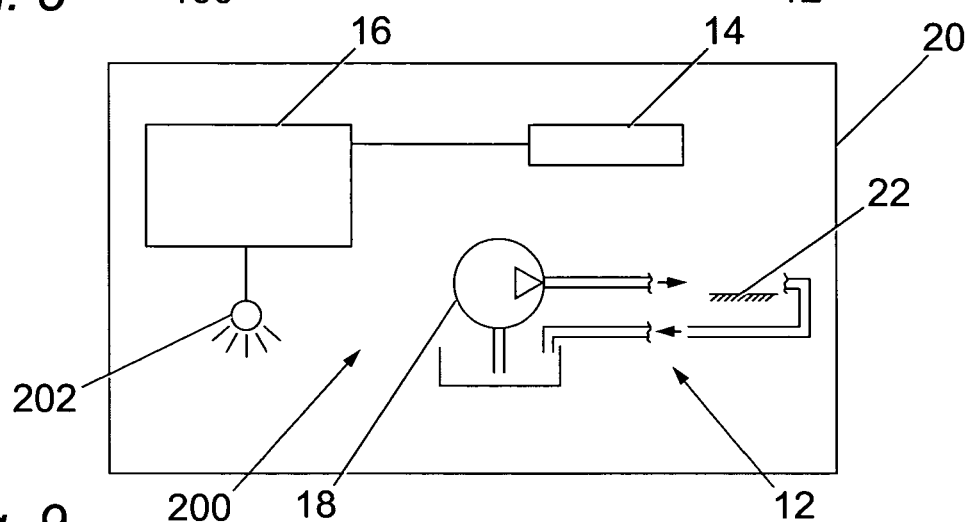
FIG. 9 is a diagrammatic representation of a third embodiment of a coolant system in accordance with this invention.

FIG. 9 illustrates a third embodiment of a coolant system, generally designated 200, in accordance with this invention. The coolant system 200 includes an indicator 202 that is activated in response to a change in at least one parameter of the signal from sensor 14. As will be described below, a change in the signal parameters can indicate that the coolant system has changed or is about to change boiling states and heat transfer regimes, and thus the indicator can indicate to the system operator intervention is needed to avoid or reverse an undesirable boiling state change. Alternatively, the coolant system 10 may automatically change coolant flow to avoid or reverse the state change, in which case the indicator could merely provide notice to the operator that a potentially damaging state change has occurred and should be investigated. The operator need not know the particulars of the boiling state, but instead only needs to know that activation of the indicator means some operator intervention is needed to change the coolant flow adjacent to the surface 22.

Figure 10:
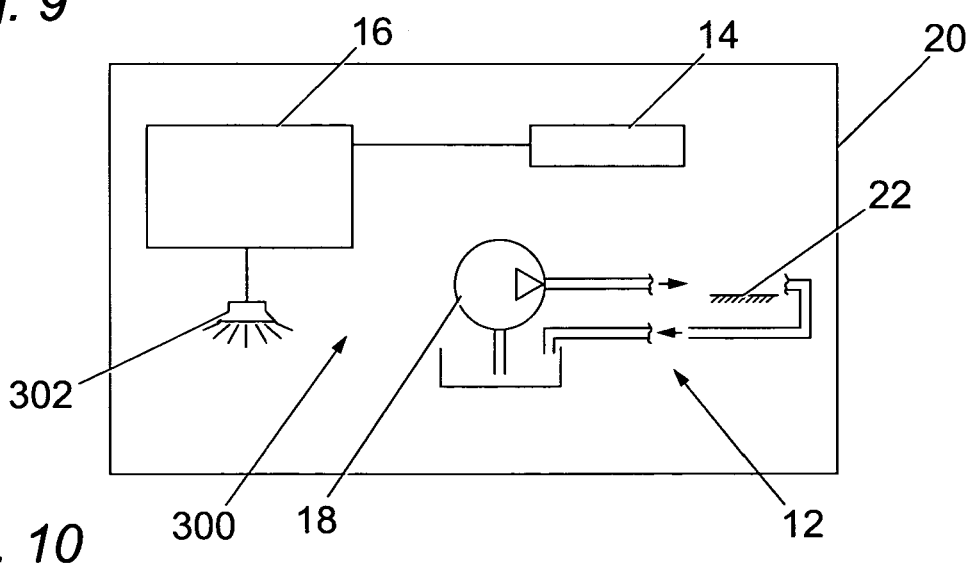
FIG. 10 is a diagrammatic representation of a fourth embodiment of a coolant system in accordance with this invention.

The indicator of FIG. 9 provides as visual indication, as by illuminating a lamp on a control panel (not shown) or providing an indication on a control screen for example. FIG. 10 illustrates a fourth embodiment of a coolant system, generally designated 300, in which the indicator 302 is an audible indicator, such as a buzzer, siren, or even an audible verbal indication. In yet another embodiment (not shown) the indicator can provide both an audible and a visual indication to the operator.

INDUSTRIAL APPLICABILITY

With references to FIGS. 2 through 7, a coolant system according to this invention can be used to provide feedback regarding the boiling state and heat transfer regime of the coolant adjacent to the surface 22 and thus permit the coolant flow to be changed to avoid damaging film boiling heat transfer. In this regard, the sensor(s) 14 are positioned at or near surfaces 22 in the coolant circuit 12 that are likely to be exposed to high heat flux and which thereby have a risk of film boiling heat transfer. In Diesel-cycle internal combustion engines, for example, locations in the coolant circuit 12 that are especially susceptible to high heat flux are the valve bridge between the intake and exhaust ports and the area near the fuel injector. The selection of advantageous locations for placement of sensors 14 is dependent upon the particular cooling application and can be readily determined by those knowledgeable about the particular cooling application.

As mentioned above, coolant flow adjacent to the surface 22 can be changed in response to changes in one or more parameters of the signal(s) from sensor(s) 14. One parameter of the sensor signal(s) is the frequency or rate of bubble departure, which corresponds to the frequency of temperature peaks or the frequency of rapid temperature decreases. This parameter is best seen with reference to FIG. 4. The controller 16 can determine the average rate of bubble departure based on the fluctuations in surface temperature represented in the sensor signal. Because the rate of bubble departure increases as the coolant moves from early-stage discrete nucleate boiling to vigorous discrete nucleate boiling, the controller can be programmed to change the coolant flow adjacent to the surface or an indicator can be activated if the bubble departure rate exceeds a predetermined rate. As apparent, if slug boiling is a boiling state that is undesirable because of the risk of transition to film boiling, then the predetermined bubble departure rate can be selected as a rate corresponding to a transition from discrete nucleate boiling to slug boiling. By way of example, a bubble departure rate in excess of 50 bubbles per second may be indicative of a departure from discrete nucleate boiling. Step changes in bubble departure can also be indicative of a transition from discrete nucleate boiling to slug boiling or to film boiling and, thus, sensed step changes in bubble departure rate can also be used to trigger a change of coolant flow. The coolant flow can be changed automatically or by operator intervention in any of the manners described above.

With reference to FIGS. 4 through 8, another parameter of the sensor signal is the change in surface temperature, $\Delta T$, that occurs upon departure of a bubble or slug from the surface 22. As shown in the figures, $\Delta T$ decreases as the coolant moves from discrete nucleate boiling to slug boiling to film boiling. Thus, coolant flow adjacent to the surface 22 can be changed if $\Delta T$ is less than some predetermined value that corresponds to a predetermined boiling state. For example, since slug boiling may be undesirable due to the risk of transition to film boiling and slug boiling is characterized by $\Delta T$ less than 1° C. to 2° C., coolant flow can be changed if $\Delta T$ is less than 2° C. The coolant flow can be changed automatically by the controller 16 or by operator intervention using any of the coolant flow control methods described above.

Yet another parameter of the sensor signal is the temperature gradient after a bubble or slug departs the surface 22 and the surface temperature $T_s$ begins to increase prior to departure of the next bubble or slug. In this regard, the temperature gradient is defined as the change of surface temperature $T_s$ over time t, or in other words the rate of change of surface temperature $T_s$ or $dT_s/dt$. The controller can determine the temperature gradient based on the sensor signal, and as appropriate, the coolant flow adjacent to the surface 22 can be changed as described above. Again, with regard to slug boiling as an undesirable state, slug boiling is expected to result in a relative low temperature gradient. Thus, coolant flow can be changed if the temperature gradient is less than a predetermined value. For example, a temperature gradient less than about 10° C. per second may indicate slug boiling, and thus, coolant flow can be changed if the temperature gradient less than about 10° C. per second. As above, the coolant flow can be changed in any of the described manners either automatically or by operator intervention.

The coolant control system of this invention may also rely on changes in a combination of any of the parameters as described above to trigger a change in coolant flow adjacent to the surface 22. For example, coolant flow adjacent to the surface 22 can be changed if bubble departure rate exceeds a predetermined rate (e.g. rate >50/second) and $\Delta T$ is less than a predetermined value (e.g. $\Delta T<2°$ C.), since this combination of conditions would indicate slug boiling or an imminent transition to slug boiling. In addition, another parameter of the signal is the absolute value of the surface temperature $T_s$, which may be combined with any of the other parameters in control algorithms used to determine the boiling state of the coolant. For example, a transition to slug boiling or a transition to film boiling may be indicated by a decrease in bubble departure rate accompanied by an increase in the surface temperature $T_s$. Where a sensor 14 includes either a thermocouple or a thermistor, the sensor 14 can provide the surface temperature T as well as a signal representative in fluctuations of the surface temperature T.

The coolant control system may also rely on changes in parameters of the signal other than those identified above. For example, advanced signal processing such as Fast Fourier Transform (FFT), for example, may provide data regarding other aspects of the fluctuations in the temperature $T_s$ that are indicative of a particular boiling state or boiling state change.

Although the description above emphasizes changing coolant flow to avoid transitions to more vigorous state of boiling, those skilled in the art will recognize that changes in the various parameters may be used to determine that a transition to only convective heat transfer is imminent or has occurred. For example, a bubble departure rate less than a predetermined rate can indicate a transition from nucleate boiling to convective heat transfer, so coolant flow can be changed to ensure that the coolant remains in a nucleate boiling heat transfer regime.

As now apparent, the controller can be programmed to effectively determine the boiling state of the coolant. The boiling state can be (1) not boiling, (2) early stage discrete nucleate boiling, (3) vigorous discrete nucleate boiling, (4) slug boiling, (5) transition boiling (which only occurs, if ever, during a transition from film boiling back to slug boiling), and (6) film boiling. If the boiling state is determined to be a predetermined state, the coolant flow adjacent to the surface 22 can be changed as described above. For example, if the coolant is in a state of at least slug boiling, coolant flow can be changed. The phrase "at least slug boiling" is used herein to mean slug boiling or any state to the right of slug boiling in FIG. 1. Similarly, "not more than vigorous discrete nucleate boiling" would mean vigorous nucleate boiling or any state to the left of vigorous discrete nucleate boiling in FIG. 1.

As mentioned above, each sensor 14 can include an array or line of sensor instruments at or near the surface 22. In that case, the controller 16 will receive multiple sensor instrument signals, and coolant flow would be changed only if several of the sensor instruments indicate the relevant parameter change or relevant change is boiling state. For example, coolant flow could be changed if only specified percentage (e.g. more than 50%) of the sensor instruments have signal parameters indicative of slug boiling. In contrast, multiple discrete sensors 14 can be placed at or near a number of different surfaces 22 in the coolant circuit (in which case each sensor may include plural sensor instruments). In this arrangement, coolant flow would be changed if the parameters of any one of the sensor signals change to indicate an undesirable boiling state.

In addition to the feedback control feature described above, the coolant control system of this invention can be used to log coolant events that may be the cause of damage to the device 20. As a result, if damage occurs, the owner or operator of the device or a service technician can refer to the log to determine whether the root cause of the damage may be from film boiling. This information may also be used to determine whether the device 20 was operated in accordance with instructions provided by the manufacturer to thereby determine whether any damage is covered under applicable manufacturers warranties or to determine whether damage or system failure resulted from operator error.

As apparent, this invention has application to a wide range of coolant systems. This invention may be particularly advantageous in enhancing the performance of power sources, such as internal combustion engines (reciprocating or rotary/turbine), nuclear power plants, and fuel cells. In addition, another application that may benefit from the coolant system of this invention is the cooling of semiconductor chips, such as microprocessors. The coolant system may also be used with other devices such as HVAC systems, household refrigeration devices, and machine tools, or in casting and manufacturing processes.

In the context of internal combustion engines, the coolant system of this invention may allow engines to operate at higher performance levels, in terms of power output and/or reduced emissions levels, without significant risk of damage due to film boiling. In addition, the coolant system of this invention may be used to prevent damage during periods when coolant flow is reduced or stopped, such as a hot-shutdown of the engine. In that instance, a coolant pump, such as an electric pump, can be operated after shutdown as needed to prevent undesirable film boiling. Because the system can be automatic, an operator can shut-shown the engine without the usual "cool down" period that is normally recommended before shutting down a high-performance engine. As apparent, for applications of this invention to internal combustion engines at least, it may be desirable to utilize a variable delivery coolant pump that can change its output flow rate independent of engine speed. Examples of suitable variable delivery pumps are electric pumps or mechanically driven pumps that have either variable displacement or variable effective displacement.

Yet another application of the coolant system of this invention with regard to internal combustion engines is to prevent engine damage during motorsport competitions. During motorsport competitions, an engine may be operated at high load/high speed for a long period and then operated at low load/low speed. For example, this scenario occurs when a race vehicle stops for service during a "pit stop" or if the competition is suddenly interrupted due to an accident on the racecourse. Because coolant systems for race vehicles are often optimized for race conditions, coolant flow during these low load/low speed conditions may not be sufficient to prevent transitions to damaging film boiling in the coolant circuit. Thus, when the race vehicle re-enters the competition, an early engine failure is possible if engine components were damaged by film boiling. The coolant system of this invention may be used to either automatically change the coolant flow during pit stops or other stoppage or to alternatively provide a signal to the vehicle driver or crew that intervention is required to avoid engine damage.

Those skilled in the art will also recognize that this invention is useful in connection with liquid circuits in which the liquid is not primarily a coolant liquid but is nonetheless potentially subject to undesirable boiling states. For example, liquid fuel in a fuel circuit of an internal combustion engine can be heated to very high temperatures during engine operations. This is particularly a concern in compression ignition engines in which the fuel is raised to pressures up to 200 MPa or more, with the fuel being heated both by this pressurization and its travel through heated engine components, but the problem may also exist in spark ignited engines. In addition, it is well known to use fuel as a liquid coolant for cooling engine components such as the engine's electronic controller. Therefore, this invention may be used to detect whether fuel is an undesirable boiling state and, if needed, change the fuel flow. The boiling state may be determined for fuel in either the fuel lines, the fuel injectors, in the fuel reservoir, or in a combination thereof.

Although the preferred embodiments of this invention have been described herein, improvements and modifications may be incorporated without departing from the scope of the following claims.

What is claimed is:

1. A liquid system, comprising:
   a liquid circuit in which liquid can flow adjacent a surface in the liquid circuit; and
   a sensor adapted to provide a sensor signal having at least one parameter, the sensor signal being representative of fluctuation in temperature at the surface in said liquid circuit;
   wherein liquid flow adjacent to said surface is changeable in response to a change in the at least one parameter of the sensor signal.

2. The liquid system of claim 1 wherein said liquid comprises fuel.

3. The liquid system of claim 1 wherein said liquid comprises coolant.

4. The liquid system of claim 3 comprising a signal processor including a controller adapted to determine a boiling state of the coolant based on the sensor signal, and wherein said coolant flow adjacent to the said surface is changeable in response to the controller determining the coolant to be in a predetermined state.

5. The liquid system of claim 4 wherein the controller is operable to change coolant flow adjacent to said surface in response to the boiling state determined by said controller.

6. The liquid system of claim 5 wherein said controller is operable to automatically change coolant flow adjacent to said surface in response to the boiling state determined by said controller.

7. The liquid system of claim 4 wherein said at least one parameter of said signal corresponds to a gradient of temperature change after bubbles depart from said surface.

8. The liquid system of claim 4 further comprising an indicator operable to provide an indication to an operator in response a determination by said controller that the cooling is in a predetermined boiling state.

9. The liquid system of claim 8 wherein said predetermined state is at least slug boiling.

10. The liquid system of claim 3 wherein said sensor includes a thermocouple.

11. The liquid system of claim 3 wherein said sensor includes a thermistor.

12. The liquid system of claim 3 wherein said sensor comprises plural sensor instruments.

13. The liquid system of claim 12 further comprising a second sensor adapted to provide a sensor signal that is representative of temperature fluctuations in coolant adjacent to the surface.

14. The liquid system of claim 3 wherein said sensor also provides a sensor signal that is representative of the temperature at or near the surface.

15. The liquid system of claim 3 wherein said at least one parameter of said signal corresponds to a gradient of temperature change after bubbles depart from said surface.

16. The liquid system of claim 3 comprising plural sensors each adapted to provide a signal representative of fluctuation in temperature at a corresponding surface in said coolant circuit.

17. The liquid system of claim 3 further comprising a coolant pump, and wherein said coolant flow is changeable by changing an output flow rate of said coolant pump.

18. The liquid system of claim 3 further comprising a coolant flow control valve, and wherein said coolant flow is changeable by changing the flow of coolant through said valve.

19. The liquid system of claim 3 wherein said coolant flow is changeable by changing the velocity of the coolant flow.

20. The liquid system of claim 3 whereon said coolant flow is changeable by changing the temperature of the coolant flow.

21. The liquid system of claim 3 further comprising an indicator operable to provide an indication to an operator in response to a change in at least one parameter of the sensor signal.

22. The liquid system of claim 21 wherein said indication is visual.

23. The liquid system of claim 21 wherein said indication is audible.

24. The liquid system of claim 21 wherein coolant flow is changeable by operator intervention in response to activation of said indicator.

25. The liquid system of claim 1 wherein said at least one parameter of said signal corresponds to a rate at which vapor bubbles depart from said surface.

26. The liquid system of claim 1 wherein said at least one parameter of said signal corresponds to a change in surface temperature upon departure of bubbles from said surface.

27. The liquid system of claim 26 wherein said coolant flow is changed if said change in surface temperature is less than a predetermined amount.

28. The liquid system of claim 27 where said coolant flow is changed if said change in surface temperature is less than about 2 degrees.

29. The liquid system of claim 1 wherein said at least one parameter of said signal corresponds to a gradient of temperature change after bubbles depart from said surface.

30. The liquid system of claim 1 comprising a controller configured to receive the sensor signal and determine a change in the at least one parameter of the sensor signal.

31. The liquid system of claim 1 comprising a signal processor configured to receive the sensor signal and determine a change in the at least one parameter of the sensor signal and configured to provide advanced signal processing.

32. A method of controlling a liquid system, comprising:
   (a) causing liquid to flow with first flow parameters adjacent a surface in a liquid circuit;
   (b) creating a signal having at least one signal parameter, the signal being representative of fluctuation in temperature at or near the surface in said liquid circuit; and
   (c) causing liquid to flow adjacent to said surface with second flow parameters different from said first flow parameters in response to a change in the at least one signal parameter of said signal.

33. The method of claim 32 wherein said liquid comprises fuel.

34. The method of claim 32 wherein said liquid comprises coolant.

35. The method of claim 34 further comprising:
   determining a boiling state of the coolant based on changes in the at least one signal parameter; and
   causing coolant to flow adjacent to said surface with said second flow parameters in response to said coolant being in a predetermined boiling state.

36. The method of claim 35 further comprising:
   providing an indication to an operator that said coolant is in a predetermined boiling state; and
   causing coolant to flow adjacent to said surface with said second flow parameters by way of an act of the operator in response to said indication.

37. The method of claim 36 wherein said indication is visual.

38. The method of claim 36 wherein said indication is audible.

39. The method of claim 36 wherein said at least one signal parameter corresponds to a gradient of temperature change after a vapor bubble departs from said surface.

40. The method of claim 35 wherein said predetermined boiling state is at least slug boiling.

41. The method of claim 35 wherein said at least one signal parameter corresponds to a gradient of temperature change after a vapor bubble departs from said surface.

42. The method of claim 34 wherein step (c) is carried out automatically in response to a change in the at least one signal parameter.

43. The method of claim 34 wherein step (c) is carried out automatically in response to a determination that said coolant is in a predetermined state.

44. The method of claim 34 wherein said predetermined boiling state is at least slug boiling.

45. The method of claim 34 wherein said signal is created by a thermocouple.

46. The method of claim 34 wherein said signal is created by a thermistor.

47. The method of claim 34 wherein said at least one signal parameter corresponds to a rate at which vapor bubbles depart from said surface.

48. The method of claim 34 wherein said at least one signal parameter corresponds to a change in surface temperature upon departure of a vapor bubble from said surface.

49. The method of claim 48 further including determining whether said fluctuation in temperature is less than a predetermined amount.

50. The method of claim 49 wherein the predetermined amount is less than about 2° C.

51. The method of claim 34 wherein said at least one signal parameter corresponds to a gradient of temperature change after a vapor bubble departs from said surface.

52. The method of claim 34 wherein said liquid system comprises a liquid system for a power source.

53. The method of claim 34 wherein said liquid system comprises a liquid system for cooling a semiconductor chip.

54. A method for controlling a liquid system comprising a liquid circuit having a surface therein having liquid adjacent thereto, comprising:
measuring fluctuations in a temperature at or near said liquid circuit surface; and
changing liquid flow adjacent to said liquid circuit surface in response to changes in the fluctuations in temperature at or near said coolant circuit.

55. A liquid system, comprising:
a liquid circuit in which liquid can flow adjacent a surface in the liquid circuit; and
a sensor adapted to provide a signal representative of a boiling state of the liquid by measuring fluctuations of at least one parameter of the surface in said liquid circuit;
wherein the liquid circuit is configured so that the liquid flow adjacent to said surface is changeable in response a change in the boiling state of the liquid.

56. The liquid system of claim 55 wherein the at least one parameter is a rate at which vapor bubbles depart from said surface.

57. The liquid system of claim 55 wherein the at least one parameter is a change in surface temperature upon departure of bubbles from said surface.

58. The liquid system of claim 55 wherein the at least one parameter is a gradient of temperature change after bubbles depart from said surface.

59. The liquid system of claim 55 further comprising an indicator configured to indicate to an operator a change in the at least one parameter of the sensor signal.

60. The liquid system of claim 59 wherein said indication is at least one of visual and audible.

61. The liquid system of claim 59 wherein coolant flow is changeable by operator intervention in response to activation of said indicator.

62. The liquid system of claim 55 further comprising an indicator operable to provide an indication to an operator in response a determination by said controller that the cooling is in a predetermined boiling state.

63. A method for cooling using a liquid system, comprising:
causing a liquid to flow adjacent a surface in a liquid circuit;
measuring fluctuations of a parameter at the surface in said liquid circuit; and
providing a signal representative of a boiling state of the liquid,
changing the liquid flow adjacent to said surface in response a change in the boiling state of the liquid.

64. The method of claim 63 wherein the at least one parameter is a rate at which vapor bubbles depart from said surface.

65. The method of claim 63 wherein the at least one parameter is a change in surface temperature upon departure of bubbles from said surface.

66. The method of claim 63 wherein the at least one parameter is a gradient of temperature change after bubbles depart from said surface.

67. The method of claim 63 further comprising indicating to an operator a change in the at least one parameter of the sensor signal.

68. The method of claim 67 wherein said indicating to an operator is accomplished by at least one of a visual and an audible indicator.

69. The method of claim 67 further comprising changing the coolant flow by operator intervention in response to the step of indicating.

70. The method of claim 63 further comprising providing an indication to an operator that the liquid is in a predetermined boiling state.

71. A liquid system, comprising:
a liquid circuit in which liquid can flow adjacent a surface in the liquid circuit;
a sensor adapted to provide a signal representative of at least one parameter at the surface in said liquid circuit; and
a controller configured to receive the sensor signal and detect fluctuations of the parameter of the surface of said liquid circuit,
wherein liquid flow adjacent to said surface is changeable in response to the detected fluctuation.

72. The liquid system of claim 71 wherein said at least one parameter is a rate at which vapor bubbles depart from said surface.

73. The liquid system of claim 71 wherein said at least one parameter is a change in surface temperature upon departure of bubbles from said surface.

74. The liquid system of claim 71 wherein said at least one parameter is a gradient of temperature change after bubbles depart from said surface.

75. A method of controlling a liquid system, comprising:
(a) causing liquid to flow with first flow parameters adjacent a surface in a liquid circuit;

(b) creating a signal representative of at least one liquid parameter at or near the surface in said liquid circuit;
(c) detecting a fluctuation in the liquid parameter; and
(d) in response to a change in the at least one liquid parameter of said signal, causing liquid to flow adjacent to said surface with second flow parameters different from said first flow parameters.

76. The method of claim 75 wherein said at least one parameter is a rate at which vapor bubbles depart from said surface.

77. The method of claim 75 wherein said at least one parameter is a change in surface temperature upon departure of bubbles from said surface.

78. The method of claim 75 wherein said at least one parameter is a gradient of temperature change after bubbles depart from said surface.

* * * * *